(12) United States Patent
Sevenhans

(10) Patent No.: US 6,326,914 B1
(45) Date of Patent: Dec. 4, 2001

(54) CURRENT MODE ASYNCHRONOUS DECISION A/D CONVERTER

(75) Inventor: Joannes Mathilda Josephus Sevenhans, Brasschaat (BE)

(73) Assignee: Alcatel, Paris (FR)

(*) Notice: Subject to any disclaimer, the term of this patent is extended or adjusted under 35 U.S.C. 154(b) by 0 days.

(21) Appl. No.: 09/628,441

(22) Filed: Jul. 28, 2000

(30) Foreign Application Priority Data

Aug. 25, 1999 (EP) .................................................. 99402115

(51) Int. Cl.[7] .............................. H03M 1/12; H03M 1/38

(52) U.S. Cl. ........................................... 341/156; 341/161

(58) Field of Search .................................... 341/155, 156, 341/159, 161, 163, 160

(56) References Cited

U.S. PATENT DOCUMENTS

| | | | |
|---|---|---|---|
| 4,179,687 | 12/1979 | Van de Plassche et al. . | |
| 5,731,775 | * 3/1998 | Gross et al. | 341/155 |
| 5,886,659 | * 3/1999 | Pain et al. | 341/155 |
| 5,990,820 | * 11/1999 | Tan | 341/161 |
| 6,011,502 | * 1/2000 | Kao | 341/156 |

FOREIGN PATENT DOCUMENTS 2 4996 360 A   6/1982  (FR) .

OTHER PUBLICATIONS

Article "An Embedded 240mW 10–b 50–MS/s CMOS ADC in 1–mm[2]" by K. Bult et al.

Chung–Yu, Wu et al.: "A CMOS Transistor–Only 8–B 4.5–MS/S Pipelined Analog–to–Digital Converter Using Fully–Differential Current–Mode Circuit Techniques" IEEE Journal of Solid–state Circuits, US, IEEE, Inc. New York, vol. 30, No. 5, p. 522–532 XP000510254 ISSN: 0018–9200.

Shim, S. H. et al.: "A 10–Bit Current–Mode Low–Power CMOS A/D converter with a Current Predictor and a Modular Current Reference" Midwest Symposium on Circuits and Systems, US, New–York, NY: IEEE, p. 342–345 XP000787791 ISBN: 07803–3695–X.

* cited by examiner

*Primary Examiner*—Patrick Wamsley
(74) *Attorney, Agent, or Firm*—Sughrue, Mion, Zinn, Macpeak & Seas, PLLC

(57) ABSTRACT

An analog-to-digital converter (ADC) for telecommunication applications such as ASDLNDSL UMTS/GPRS wherein the conversion is realized in current mode instead of voltage mode. The power consumption is thereby reduced and the converter is adapted to be used in (low voltage) battery operated products. The structure of the converter is also simplified because summing of currents is easier than summing of voltages. The converter comprises at least a first set of N=64 first current cells (CC) coupled in parallel between lines (L+, L–) of a differential current bus. Each first current cell comprises a current source (ICC) to supply a first additional current (64×Iref) to the current bus under control of first comparator circuits (COMP1+, COMP1–). The first comparator circuits of the current cells are coupled in cascade and activated step-by-step one after each other.

In a preferred embodiment, the converter (ADC) further includes one or more second set of N second current cells (FC) also coupled in parallel between the lines (L+, L–) of the differential current bus and similar to the first current cells. The second cells however include an amplifier (AMP2+, AMP2–) with a gain N coupled between the lines and second comparator circuits (COMP2+, COMP2–), and have a second current source (IFC) to supply a second additional current (Iref) to the current bus under control of the second comparator means. Moreover, the second current cells are activated (F2) after the operation of the first current cells of the first set is completed. The amount of hardware is thereby reduced, e.g. by factor of $2^5$, as well as the cost owing to a smaller silicon area on the chip.

12 Claims, 1 Drawing Sheet

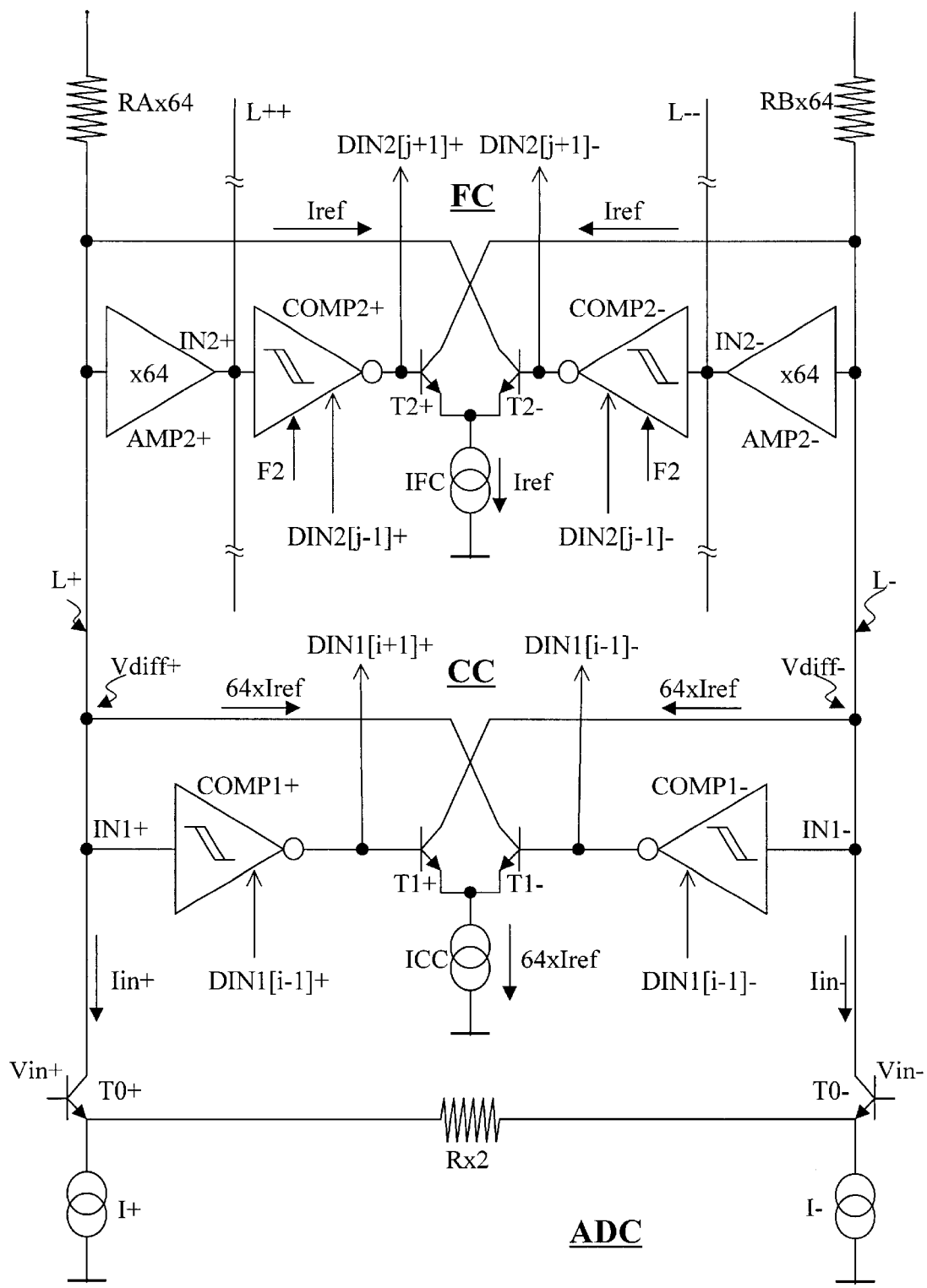

CURRENT MODE ASYNCHRONOUS DECISION A/D CONVERTER

The present invention relates to an analog-to-digital converter. More particularly to an analog-to-digital converter to be used in telecommunication applications such as ASDL/NDSL UMTS/GPRS that require a very high resolution, high speed, a low power consumption, a low supply voltage, a small silicon area on the electronic chip, and preferably at low cost.

Analog-to-digital converters [ADC] are generally known in the art, e.g. from the article "An Embedded 240mW 10-b 50-MS/s CMOS ADC in 1-mm$^2$" by K. Bult et al. Therein is disclosed an averaging "flash" analog-to-digital converter. The flash architecture allows achieving a fast analog-to-digital [A/D] conversion that is performed in voltage mode, i.e. by summing voltages. This requires a relatively high voltage supply, e.g. several batteries. Additionally, a large amount of very accurate and fast comparators is required. According to the article, the last problem is solved by "averaging" the converter and by reducing the total chip area by using the "folding" technique. The purpose of folding is to reduce the number of comparators by using each comparator more than once. Obviously, folding requires a relatively sophisticated digital control.

An object of the present invention is to provide an analog-to-digital converter of the above known type but adapted to operate at low voltage supplies.

According to the invention, this object is achieved due to the fact that the converter of the invention comprises a first set of first current cells coupled in parallel between a first current line and a second current line of a differential current bus, said lines carrying a balanced differential input current corresponding to a differential analog input signal of said converter, each first current cell of said set comprising first current source means adapted to supply a first additional current to said first and second current lines under control of first comparator means, the first comparator means of the first current cells of said first set are coupled in cascade, the first comparator means having first inputs coupled to said first and second current lines, second inputs coupled to outputs of first comparator means of a preceding first current cell in the cascade, and outputs coupled to second inputs of first comparator means of a next first current cell in the cascade.

In this way, The A/D conversion is realized in current mode instead of voltage mode. The power consumption is thereby reduced and the device is adapted to be used in battery operated products. The structure of the device is thereby also simplified because summing of currents is easier than summing of voltages. Indeed, operating in current mode is known to allow easy summing of signals by paralleling up the currents in a summing node. Furthermore, the present converter uses an Asynchronous Decision algorithm during the conversion of samples. Asynchronous logic is known in the art to be low power and high speed, e.g. compared to synchronous pipelined structures. The present converter can thus be seen as a Current Mode Asynchronous Decision A/D converter [CMAD].

Another characteristic feature of the present invention is that said converter comprises a second set of second current cells also coupled in parallel between said first and said second current lines of said differential current bus, each second current cell of said second set comprising second current source means adapted to supply a second additional current to said first and second current lines under control of second comparator means, the second comparator means of the second current cells of said second set are coupled in cascade, the second comparator means having first inputs coupled to said first and second current lines via respective amplifier means, second inputs coupled to outputs of second comparator means of a preceding second current cell in the cascade, and outputs coupled to second inputs of second comparator means of a next second current cell in the cascade, and that the second current cells of said second set are activated after the operation of the first current cells of said first set is completed.

In this way, the principle of "sub-ranging" the converter into two sets of current cells is applied. This reduces the amount of hardware, whereby the cost is also reduced owing to a smaller silicon area on the chip. For instance, if a "n"=12 bit digital word has to be obtained, the amount of hardware is reduced from $2^n=2^{12}$ to $2\times2^{n/2}=2\times2^6$. This is a factor of $2^5$ reduction of hardware.

A known problem of sub-ranging is that it is difficult to match the gain curve of the 2 sub-ranges in the A/D converter total dynamic range. The known prior art solution to this is an overlap of the sub-ranges and a digital correction afterwards. In the present invention, the 2 sub-ranges are summing up in the same current nodes, i.e. the first and the second lines of the differential current bus, so there is only one gain curve for the 2 sub-ranges and no need for overlap nor digital correction. Still the lower sub-range, i.e. the second set of second current cells, needs an additional gain of $2^{n/2}=2^{12/2}=2^6=64$. This additional gain is achieved by the amplifier means and is thus put in the digital decision path and not in the analog signal path. Therefore, the gain of $2^6$ is not critical for the analog linearity of the A/D converter, as long as the gain tolerances stay within the comparator's hysteresis. The present A/D architecture is thereby robust towards technology and analog circuit tolerances.

The present invention is further characterized in that the operation of the first current cells of said first set is completed after a first half clock cycle, and in that, at the beginning of the second half of a clock cycle, a clock signal is applied to said second comparator means of at least the first second current cell in the cascade in order to activate the operation of the second current cells of said second set.

Also another characteristic feature of the present invention is that said converter comprises N−1 second sets of second current cells, said second sets operating in sequence, a second set being only activated after the operation of the second current cells of another second set is completed.

More generally, what is discussed above for a 2 sub-ranging may be extended to a N sub-ranging. The amount of hardware in then reduced from $2^n$ to $N\times2^{n/N}$, where N is the number of sub-ranges, i.e. the first set of first current cells and the N−1 second sets of second current cells, and n the number of bits of the digital word. Clearly in this case, the N sub-ranges operate in N successive phases of the clock cycle.

A further characteristic of the present invention is that the first inputs of said second comparator means of the second current cells of said second set are connected to a first voltage line and a second voltage line forming together a voltage bus.

This increases the stability of the A/D converter and more particularly the accuracy of the second set(s) of second current cells thereof.

Yet another characteristic feature of the present invention is that said differential analog input signal is a differential voltage applied to control terminals of active devices of which the main path interconnects current sources with said first and second current lines, and that said first and second current lines are provided with impedance means adapted to convert said balanced differential input current flowing through the current lines into a differential voltage.

In this way, the device is adapted to operate with an input current as well as with an input voltage.

Another advantage of the present invention is that an accurate A/D conversion is obtained in a same technology, e.g. CMOS or BICMOS.

Further characteristic features of the present analog-to-digital converter [ADC] are mentioned in the appended claims.

The above and other objects and features of the invention will become more apparent and the invention itself will be best understood by referring to the following description of an embodiment taken in conjunction with the accompanying drawing wherein the figure represents an analog-to-digital converter ADC according to the invention.

The shown analog-to-digital converter ADC is adapted to convert a differential analog current Iin+, Iin− or a differential analog voltage Vin+, Vin− into a n-bit digital word, say n=12 in the following example of embodiment. ADC comprises a first set or sub-range of $2^{n/2}=2^{12/2}=64$ first current cells of which only one first current cell CC is shown, and a second set or sub-range also of $2^{n/2}=2^{12/2}=64$ second current cells of which only one second current cell FC is shown. The first set of first current cells is called "coarse" comparator, whilst the second set of second current cells is called "fine" comparator.

It is to be noted that, although the following description relates to an analog-to-digital converter comprising 2 sub-ranges of current cells CC and FC, the full specification is also valid for a converter comprising more than 2 sub-ranges, say N. The number of current cells forming part of each sub-range is then $2^{n/N}$, and each sub-range operates in 1 of N successive phases of the clock cycle. In more detail, the converter will then comprise 1 first set of first current cells as CC and N−1 second sets of second current cells similar to FC.

The sets operate in sequence starting with the first set, a second set being only activated after the operation of the current cells of the previous set in the sequence is completed.

The present analog-to-digital converter ADC is a Current Mode Asynchronous Decision A/D converter [CMAD] intended to be used in telecommunication applications such as ASDLNDSL UMTS/GPRS systems; with ADSL= Asymmetric Digital Subscriber Line, VDSL=Very High Data Digital Subscriber Line, UMTS=Universal Mobile Telephone System, and GPRS=General Packet Radio System.

Depending on the application, the input can be a differential current Iin+, Iin− or a differential voltage Vin+, Vin−. If it is a voltage, a voltage-to-current conversion is performed by transistors T0+, T0−, to the gates of which the differential analog input voltage Vin+, Vin− is applied. The differential analog input current Iin+ and Iin− is then obtained in a differential, balanced circuit constituted by two current lines L+ and L− of a differential current bus. These current lines L+ and L− couple the collectors of the transistors T0+ and T0− to a supply voltage via resistors RAx64 and RBx64 respectively, the emitters of the transistors being connected to a grounded current source I+, I−. The current Iin+,Iin− causes a differential voltage drop Vdiff+, Vdiff− on the respective resistors RAx64, RBx64. A resistor Rx2 further interconnects the emitters of the transistors T0+ and T0−.

A voltage gain of $2^{n/2}32\;64$ is so obtained. If the input voltage signal range were 1 Volt, the differential voltage (Vdiff+−Vdiff−) would rise up to 64 Volt. With a supply voltage of 2 Volt, it is clear that Vdiff+ and Vdiff− will be clipping at the supply levels. In the present invention, this is not a problem because the coarse (and the fine) comparator will activate its $2^{n/2}$ current cells step-by-step, i.e. in cascade, until Vdiff+ and Vdiff− are within the hysteresis of the comparator. At this point, the converter ADC reaches the stable condition. For the coarse comparator, this condition must be reached before the end of a first operating phase corresponding for instance to the first half of a clock cycle. Indeed, in a second operating phase, i.e. in the second half of the clock cycle, the fine comparator has to start converting the residue of (Vdiff+−Vdiff−) into the n/2 LSB's of the digital output code.

As already mentioned, the coarse comparator is constituted by 64 first current cells connected in cascade and of which only one first current cell CC is shown in the figure. Each first current cell CC includes a pair of comparator circuits COMP1+, COMP1− having first inputs IN1+, IN1−, second inputs DIN1[i−1]+, DIN1[i−1]−, and outputs DIN1[i+1]+, DIN1[i+1]−. CC further includes a current source circuit comprising a current source ICC and transistors T1+, T1−. The current lines L+, L− of the differential current bus are respectively connected to the first inputs IN1+, IN1−, whilst outputs of a previous first current cell [i−1] in the cascade are connected to the second inputs DIN1[i−1]+, DIN1[i−1]− of the comparator circuits. The outputs DIN1[i+1]+, DIN1[i+1]− of these comparator circuits are connected both to second inputs of a next first current cell [i+1] in the cascade, and to the gates of the transistors T1+, Ti− of which the emitters are connected together to the current source ICC. The collectors of these transistors T1+, Ti− are respectively cross-connected to the current lines L+, L+.

The current source ICC provides a first additional current equal to a reference current Iref multiplied by n/2, i.e. in the present example 64×Iref. This current 64×Iref flows to the current lines L− and L+ via the emitter-to-collector path of the transistors T1+ and T1− respectively. These transistors are controlled by the comparator circuits COMP1+, COMP1− to which are applied the differential voltage Vdiff+, Vdiff− and the output signal of the previous cell in the cascade of the coarse comparator.

Similarly to the coarse comparator, the fine comparator is constituted by 64 second current cells also connected in cascade and of which only one second current cell FC is shown in the figure. Each second current cell FC includes a pair of comparator circuits COMP2+, COMP2− having first inputs IN2+, IN2−, second inputs DIN2[j−1]+, DIN2[j+1]−, and outputs DIN2[j+1]+, DIN2[j+1]−. FC further includes amplifiers AMP2+, AMP2− and a current source circuit comprising a current source IFC and transistors T2+, T2−. The current lines L+, L− of the differential current bus are connected to the first inputs IN2+, IN2− via the respective amplifiers AMP2+, AMP2− whilst outputs of a previous second current cell [j−1] in the cascade are connected to the second inputs DIN2[j−1]+, DIN2[j−1]− of the comparator circuits. The outputs DIN2[j+1]+, DIN2[j+1]− of these comparator circuits are connected both to second inputs of a next second current cell [j+1] in the cascade, and to the gates of the transistors T2+, T2− of which the emitters are connected together to the current source IFC. The collectors of these transistors T2+, T2− are respectively cross-connected to the current lines L−, L+.

Since the fine comparator may only be activated after the operation of the coarse comparator is completed, i.e. during the second half of the clock cycle, a clock signal F2 is applied to the second input of the comparator circuits COMP2+, COMP2− of the second current cell that is the first in the cascade. In other words, for the first cell in the cascade, the signal F2 replaces the signal at the second inputs DIN2[j−1]+, DIN2[j−1]−.

The current source IFC provides a second additional current Iref that flows to the current lines L− and L+ via the emitter-to-collector path of the transistors T2+ and T2− respectively. These transistors are controlled by the comparator circuits COMP2+, COMP2−, activated during the second half of the clock signal, and to which are applied the differential voltage Vdiff+, Vdiff− amplified by the amplifiers AMP2+, AMP2− as well as the output signal of the previous cell in the cascade of the fine comparator.

In order to increase the stability of the A/D converter ADC, the first inputs IN2+, IN2− of all comparator circuits COMP2+, COMP2− of the second current cells of the fine comparator are interconnected by means of a first and a second voltage line L++, L−− forming together a voltage bus.

The present analog-to-digital converter ADC is using a "thermometer" code. This output code appears at the output of the 2 sub-ranges of $2^{n/2}$ cells. The coarse comparator providing the n/2 MSB and the fine comparator providing the n/2 LSB of the digital output word.

The cascade connection between the cells of a comparator is an upward conditional link whereby zeros or "bubbles" in the middle of the thermometer are avoided.

For instance, in the coarse comparator, a cell [i−1] (not shown) forces the comparator circuits COMP1+, COMP1− of the next cell [i] (CC) in the cascade to the zero condition regardless of the (Vdiff+−Vdiff−) condition. This condition, controlled by the signals at outputs of the cell [i−1] connected to like-named second inputs DIN1[i−1]+, DIN1[i−1]− of the cell [i], is maintained until the cell [i−1] is activated. Then the comparator circuits COMP1+, COMPL− of the next cell [i] can start evaluating the (Vdiff+−Vdiff−) condition and drive the first additional current 64×Iref (=Iref×n/2) of the current source ICC into the differential current mode bus L+, L− to compensate the already present differential current Iin+, Iin−. This algorithm continues rippling up in the coarse range until the residue in (Vdiff+−Vdiff−) is smaller than the hysteresis of the comparator circuits COMP1+, COMP1−. For the coarse comparator, this point must be reached before the end of the first half clock cycle.

In the second half clock cycle, the fine comparator is activated by the clock signal F2 applied to the first cell of the cascade. At this point, the fine comparator continues the conversion of the residue of (Vdiff+−Vdiff−) with smaller current steps. The current steps are now equal to the second additional current Iref instead of the first additional current 64×Iref (=Iref×n/2) as during the coarse range. The second additional current Iref is thus n/2=64 times smaller than the first additional current 64×Iref.

To achieve this higher accuracy, the comparator circuits COMP2+, COMP2− of the fine comparator have to discriminate also smaller steps of (Vdiff+−Vdiff−). A first possibility is to reduce the hysteresis of the comparator circuits by 64 ($=2^{n^2}$). However, this is rather difficult to implement. In a referred embodiment, the amplifiers AMP2+, AMP2− with a voltage gain of $2^{n/2}=64$ are inserted before the comparator circuits COMP2+, COMP2−. It is to be noted that this gain (of 64) is not critical as long as the hysteresis of the comparator circuits divided by the value of the gain, i.e. here 64, is higher than this value of the gain multiplied by Iref×R, i.e. 64×Iref×R, and not higher than the double of that value. It is to be noted that all the values of R, i.e. R, RA, RB, mentioned in this description are equal.

To activate the fine comparator, the beginning of the second half cycle of the clock signal is applied to the second input F2 of the comparator circuits COMP2+, COMP2− of the first cell of the cascade. This is sufficient, because as long as the first cell of the cascade is deactivated it will not activate the next one.

At the end of the second half clock cycle, the fine comparator must have reached the stable condition where 64×(Vdiff+−Vdiff−) is smaller than the comparator's hysteresis. The total thermometer code of the coarse and the fine range is then available on the 2×64 comparator circuits to be latched to the output of the analog-to-digital converter ADC.

While the principles of the invention have been described above in connection with specific apparatus, it is to be clearly understood that this description is made only by way of example and not as a limitation on the scope of the invention, as defined in the appended claims.

What is claimed is:

1. An analog-to-digital converter characterized in that
said converter comprises a first set of first current cells (CC) coupled in parallel between a first current line (L+) and a second current line (L−) of a differential current bus, said lines carrying a balanced differential input current (Iin1+, Iin1−) corresponding to a differential analog input signal (Vin+, Vin−) of said converter, each first current cell of said set comprising a first current source (ICC; T1+, T1−) adapted to supply a first additional current (64×Iref) to said first and second current lines under control of first comparators (COMP1+, COMP1x), and the first comparators of the first current cells of said first set are coupled in cascade, the first comparators having first inputs (IN1+, IN1−) coupled to said first and second current lines, second inputs (DIN1[i−1]+, DIN1[i−1]−) coupled to outputs of first comparators of a preceding first current cell in the cascade, and outputs (DIN1[i+1]+, DIN1[i+1]−) coupled to second inputs of first comparators of a next first current cell in the cascade.

2. An analog-to-digital converter according to claim 1, characterized in that
said converter comprises a second set of second current cells (FC) also coupled in parallel between said first and said second current lines (L+, L−) of said differential current bus, each second current cell of said second set comprising a second current source (IFC; T2+, T2−) adapted to supply a second additional current (Iref) to said first and second current lines under control of second comparators (COMP2+, COMP2−), the second comparators of the second current cells of said second set are coupled in cascade, the second comparators having first inputs (IN2+, IN2−) coupled to said first and second current lines via respective amplifiers (AMP2+, AMP2−), second inputs (DIN2[j−1]+, DIN2[j−1]−) coupled to outputs of second comparators of a preceding second current cell in the cascade, and outputs (DIN2[j+1]+, DIN2[j+1]−) coupled to second inputs of second comparators of a next second current cell in the cascade, and the second current cells (FC) of said second set are activated (F2) after the operation of the first current cells (CC) of said first set is completed.

3. An analog-to-digital converter according to claim 2, characterized in that said amplifiers (AMP2+, AMP2−) have a gain of 2n/2, where n is the number of bits of the digital word to be obtained.

4. An analog-to-digital converter according to claim 3, characterized in that the current (64×Iref) generated by said first current source (ICC) is 2n/2 times larger than the current (Iref) generated by said second current source (IFC), where "n" is the number of bits of the digital word to be obtained, the current generated by said first current source being said first additional current (64×Iref), and the current generated by said second current source being said second additional current (Iref).

5. An analog-to-digital converter according to claim 2, characterized in that the operation of the first current cells of said first set (CC) is completed after a first half clock cycle, and in that, at the beginning of the second half of a clock cycle, a clock signal is applied (F2) to said second comparators (COMP2+, COMP2−) of at least the first second current cell in the cascade in order to activate the operation of the second current cells of said second set (FC).

6. An analog-to-digital converter according to claim 2, characterized in that said converter comprises N−1 second sets of second current cells, said second sets operating in sequence, a second set being only activated after the operation of the second current cells of another second set is completed.

7. An analog-to-digital converter according to claim 2, characterized in that the first inputs (IN2+, IN2−) of said second comparators of the second current cells of said second set (FC) are connected to a first voltage line (L++) and a second voltage line (L−−) forming together a voltage bus.

8. An analog-to-digital converter according to claim 2, characterized in that said second current source (IFC; T2+, T2−) comprises a second current source (IFC) connected to said first (L+) and second (L−) current lines via the main path of second active devices (T2+, T2−) of which a control terminal is connected to the outputs (DIN2[j+1]+, DIN2[j+1]−) of said second comparators (COMP2+, COMP2−).

9. An analog-to-digital converter according to claim 1, characterized in that said first current source (ICC; T1+, T1−) comprises a first current source (ICC) connected to said first (L+) and second (L−) current lines via the main path of first active devices (T1 +, T1−) of which a control terminal is connected to the outputs (DIN1[i+1]+, DIN1[i+1]−) of said first comparators (COMP1+, COMP1−).

10. An analog-to-digital converter according to claim 9, characterized in that the active devices are transistors of which the control terminal is the gate electrode and the main path is the collector-to-emitter path.

11. An analog-to-digital converter according to claim 1, characterized in that the first comparators have a hysteresis.

12. An analog-to-digital converter according to claim 1, characterized in that said differential analog input signal is a differential voltage (Vin+, Vin−) applied to control terminals of active devices (T0+, T0−) of which the main path interconnects current sources (I+, I−) with said first (L+) and second (L−) current lines, and in that said first and second current lines are provided with an impedance (RA×64, RB×64) adapted to convert said balanced differential input current (Iinl+, Iinl−) flowing through the current lines into a differential voltage (Vdiff+, Vdiff−).

* * * * *